United States Patent
Jeng

(10) Patent No.: US 6,472,271 B1
(45) Date of Patent: Oct. 29, 2002

(54) PLANARIZATION METHOD OF MEMORY UNIT OF FLASH MEMORY

(75) Inventor: Pei-Ren Jeng, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/863,303

(22) Filed: May 24, 2001

(51) Int. Cl.$^7$ ............................................. H01L 21/336
(52) U.S. Cl. ...................... 438/258; 438/697; 438/756; 438/757; 438/275; 438/279
(58) Field of Search ................... 438/257–264, 438/691–693, 756, 757; 257/641, 750

(56) References Cited

U.S. PATENT DOCUMENTS

| | | | |
|---|---|---|---|
| 5,272,117 A | * | 12/1993 | Roth et al. .................. 437/228 |
| 6,004,843 A | * | 12/1999 | Huang ......................... 438/241 |
| 6,207,501 B1 | * | 3/2001 | Hsieh et al. ................. 438/258 |
| 6,380,584 B1 | * | 4/2002 | Ogawa ......................... 257/315 |
| 6,391,718 B1 | * | 5/2002 | Jeng ............................ 438/258 |

* cited by examiner

*Primary Examiner*—Robert Kunemund
*Assistant Examiner*—Duy-Vu Deo
(74) *Attorney, Agent, or Firm*—Rosenberg, Klein & Lee

(57) ABSTRACT

The present invention discloses a planarization method of memory unit of a flash memory, wherein a patterned polysilicon layer and a silicon nitride layer are formed in turn on a semiconductor substrate. A silicon dioxide layer is then deposited by the HDPCVD technique. Next, a silicon nitride layer is deposited. Finally, the silicon nitride layer and the silicon dioxide layer thereon are simultaneously removed using hot phosphoric acid. Because the CMP technique is not used in the present invention, the problem of micro scratches will not arise. Therefore, the present invention can assure the requirement of high planarity of memory unit of the flash memory, simplify the process flow, increase the tolerance of the etching mask, and effectively enhance the function of memory unit.

11 Claims, 4 Drawing Sheets

PLANARIZATION METHOD OF MEMORY UNIT OF FLASH MEMORY

FIELD OF THE INVENTION

The present invention relates to a planarization method and, more particularly, to a planarization method of memory unit of a flash memory. The present invention can meet the requirement of high planarity of memory unit of a flash memory to avoid micro scratches.

BACKGROUND OF THE INVENTION

Along with the trend of miniaturization of electronic devices, the tolerance of defect size in IC chips becomes more stringent. For instance, for the design rule below 0.25 $\mu$m since 1998, the tolerance of defect size is 0.08 $\mu$m, but for the present design rule below 0.18 $\mu$m (2001 A.D.), the tolerance of defect size shrinks to 0.06 $\mu$m. Therefore, the requirement of planarity for each level in ICs increases. Additionally, under the development trend toward high integration of ICs, the planarity of each level in an IC directly affects the difficulty of manufacturing a multi-layer stacked architecture. Based on the above two reasons, high planarity of each level in ICs becomes an important factor of consideration in modern semiconductor process.

Recently, a kind of memory (called flash memory) developed by Intel Inc. has proceeded toward the direction of replacing the hard disk drive and acquired hot responses on the market. Now, it is the single semiconductor product growing fastest on the semiconductor market. The flash memory is a non-volatile memory. That is, the memory or data stored therein will not disappear due to interruption of supply of power. The structure of the flash memory is the same as that of the electrically erasable programmable read-only memory (EEPROM). Nevertheless, to save time and manufacturing cost, it performs the operation of memory erasing block by block instead of bit by bit.

The CMP (chemical mechanical polishing) method is a commonly used technique nowadays for the planarization of memory unit of a flash memory. Although the CMP technique has the advantage of global planarization, it is difficult to control the stop point, hence easily abrading the polysilicon. Therefore, a silicon nitride layer is usually deposited on the surface of the polysilicon for protection. However, when applying to the fabrication process having shallow trench isolations (STI), silicon nitride easily remains in recessed regions. Additionally, the CMP technique also has the drawback of easily generating micro scratches. For memory unit of a flash memory having the requirement of high planarity, the above three drawbacks will affect subsequent processes to deteriorate the data retention of devices because of leakage of charges.

Accordingly, the present invention aims to propose a planarization method of memory unit of a flash memory to resolve the above problems in the prior art.

SUMMARY OF THE INVENTION

The primary object of the present invention is to provide a planarization method of memory unit of a flash memory, wherein the etching technique is adopted to replace the prior art CMP technique so that the requirement of high planarity of memory unit of the flash memory can be assured, the fabrication process can be simplified, and the tolerance of the etching mask can be increased.

The secondary object of the present invention is to provide a planarization method of memory unit of a flash memory, wherein angular structures of silicon dioxide of larger thickness at both sides of the polysilicon thereof can increase the contact area of the polysilicon with the insulating dielectric layer and the control gate thereon so as to increase capacitance and quantity of charges and to help electric conduction, hence effectively enhancing the function of memory unit of the flash memory.

The present invention exploits the following steps to achieve the above objects. First, a semiconductor substrate is provided. A polysilicon layer, which is used as the polysilicon of peripheral circuit and the polysilicon floating gates, and a silicon nitride on the polysilicon layer are disposed on the substrate. A silicon dioxide layer is formed on the substrate. An etching process is then performed to separate the silicon dioxide layer on the silicon nitride from the silicon dioxide layer beside the silicon nitride. Next, a second silicon nitride is formed. Subsequently, the silicon nitride and the silicon dioxide on the polysilicon of peripheral circuit are removed by etching, but the memory unit is protected with photoresist. The silicon dioxide remained on the polysilicon of peripheral circuit is then removed by sideward etching. Finally, the silicon nitride and the silicon dioxide thereon are simultaneously stripped using hot phosphoric acid.

The various objects and advantages of the present invention will be more readily understood from the following detailed description when read in conjunction with the appended drawings, in which:

DETAILED DESCRIPTION OF THE PREFERRED EMBODIMENTS

FIGS. 1A to 1G are cross-sectional views showing the planarization flowchart of memory unit of a flash memory according to a preferred embodiment of the present invention.

Figure 1A:
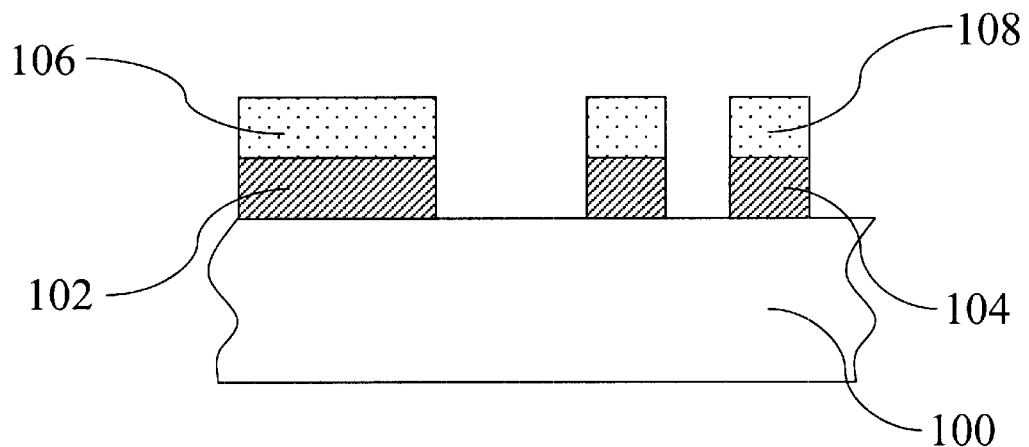
FIGS. 1A to 1G are cross-sectional views showing the planarization flowchart according to a preferred embodiment of the present invention.

As shown in FIG. 1A, a semiconductor substrate 100 is provided. A polysilicon layer and a silicon nitride layer are deposited on the semiconductor substrate 100. The pattern of memory unit is also formed to complete the polysilicon of peripheral circuit 102 and a plurality of polysilicon floating gates 104 so that a silicon nitride of peripheral circuit 106 is formed on the polysilicon of peripheral circuit 102 and a first silicon nitride 108 is formed on each of the polysilicon floating gates 104. The above polysilicon of peripheral circuit 102 and polysilicon floating gates 104 are generally deposited on the surface of the semiconductor substrate 100 using the low pressure chemical vapor deposition (LPCVD) technique, whose temperature is usually from 600 to 650° C. and whose pressure is about from 0.3 to 0.6 torr. The above silicon nitride of peripheral circuit 106 and first silicon nitride layer 108 are usually deposited on the polysilicon using the plasma enhanced CVD (PECVD) or the LPCVD technique. The silicon nitride here is used as a mask for polysilicon.

Figure 1B:
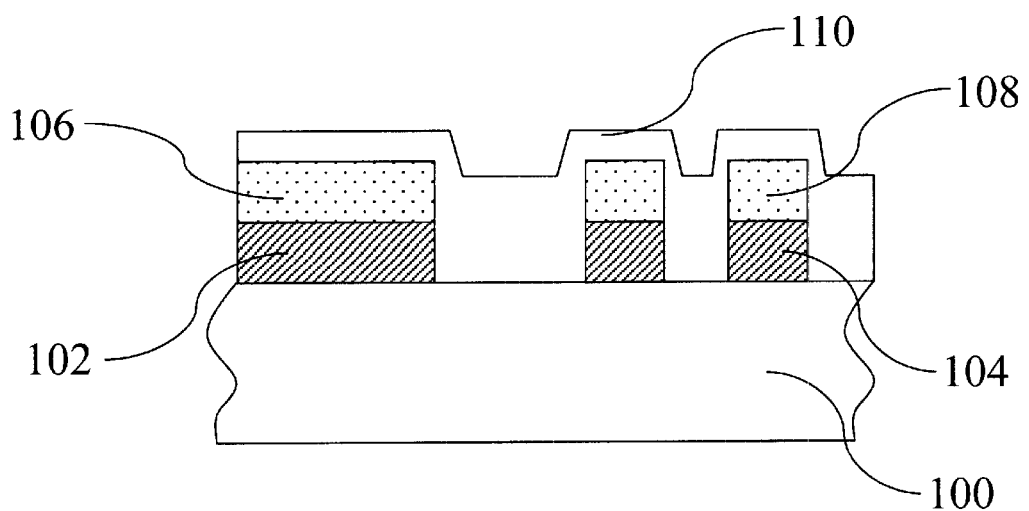

As shown in FIG. 1B, the high density plasma CVD (HDPCVD) technique is used to deposit an oxide layer 110 on the exposed surface of the silicon nitride of peripheral circuit 106, the first silicon nitride layer 108, and the semiconductor substrate 100. The oxide here is silicon dioxide. The HDPCVD is usually performed in a HDPCVD system. Therefore, the silicon dioxide deposited by the above method can form the specific covering shape shown in FIG. 1B as compared to that formed by conventional methods such as thermal oxidation, the LPCVD, and PECVD techniques.

Figure 1C:
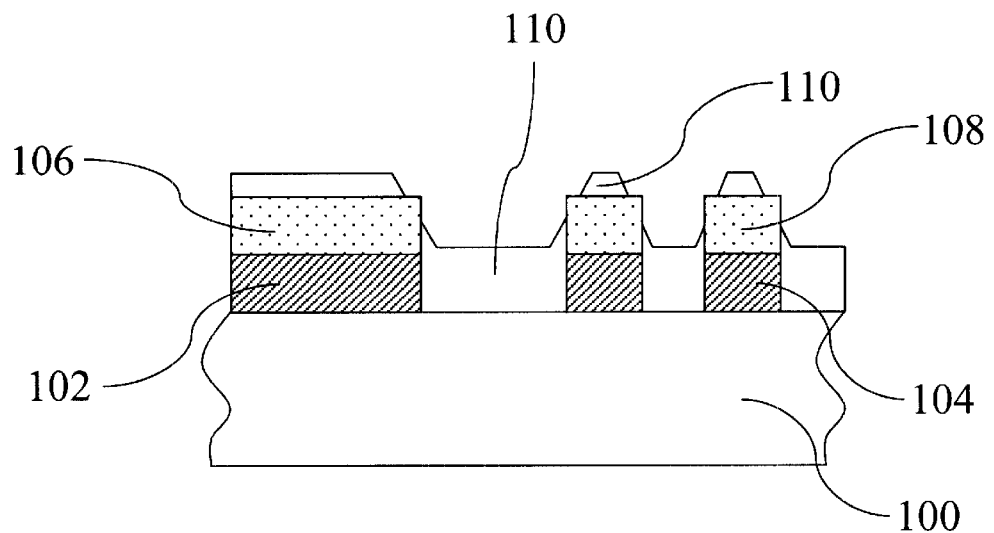

As shown in FIG. 1C, wet etching is used to etch the oxide layer 110 to separate the oxide layer 110 on and beside the silicon nitride of peripheral circuit 106 and the first silicon nitride 108, but there is still excess oxide layer 110 remained on and beside the silicon nitride of peripheral circuit 106 and the first silicon nitride layer 108. The above wet etching is usually performed using hydrofluoric acid or buffered oxide etching (BOE).

Figure 1D:
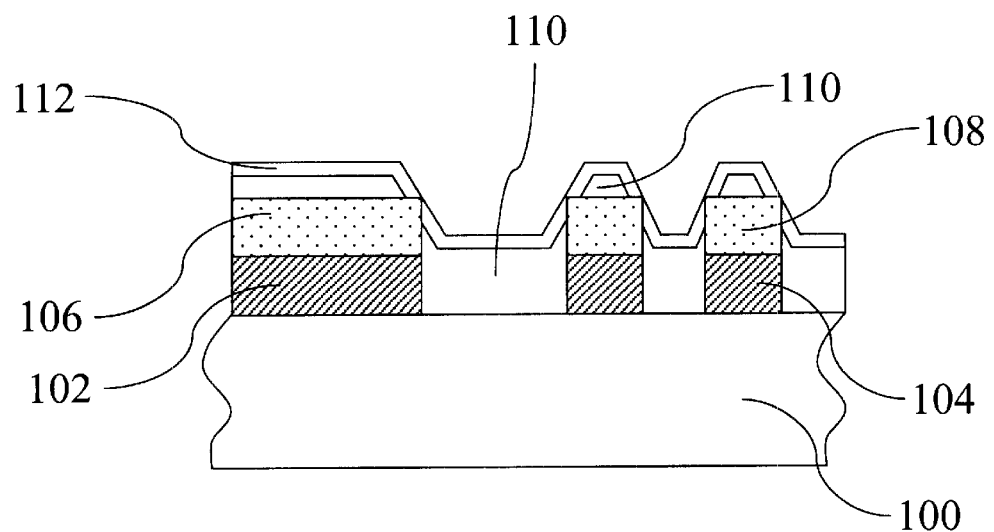

Next, as shown in FIG. 1D, a second silicon nitride layer 112 is deposited using the LPCVD or PECVD technique to cover the exposed surface of the oxide layer 110, the silicon nitride of peripheral circuit 106, and the first silicon nitride 108. The second silicon nitride 112 is used as the mask required in subsequent processes for manufacturing the memory unit. The memory unit comprises the region outside the peripheral circuit region.

Figure 1E:
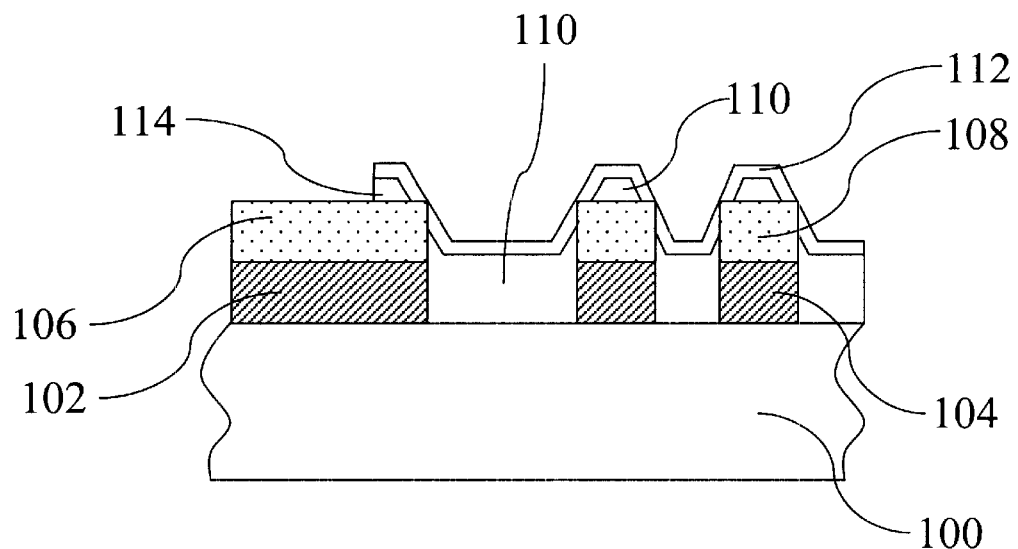

As shown in FIG. 1E, a patterned photoresist is formed to protect the memory unit of the polysilicon gate 104, and the oxide layer 110 on the silicon nitride of peripheral circuit 106 and the second silicon nitride 112 on the oxide layer 110 are removed by etching. There is still part of oxide layer 114 remained on the silicon nitride of peripheral circuit 106. Because the memory unit is protected with photoresist, it will not be affected by etching. The anisotropic dry etching technique is adopted in the above etching operation.

Figure 1F:
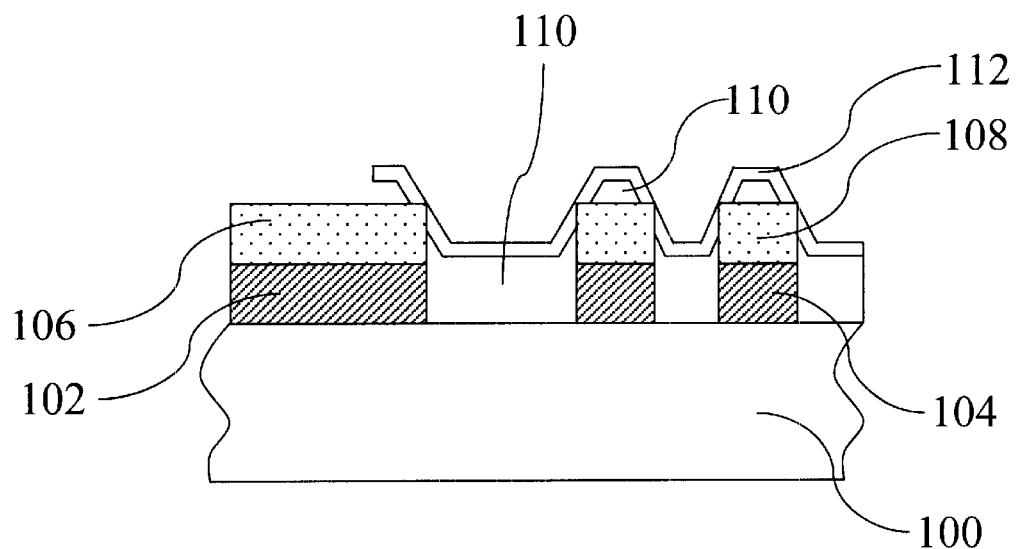

Next, as shown in FIG. 1F, the oxide layer 114 remained on the silicon nitride of periphery circuit 106 (please also refer to FIG. 1E) is removed by sideward wet etching using hydrofluoric acid or BOE, thereby increasing the manufacturing tolerance of the etching mask.

Figure 1G:
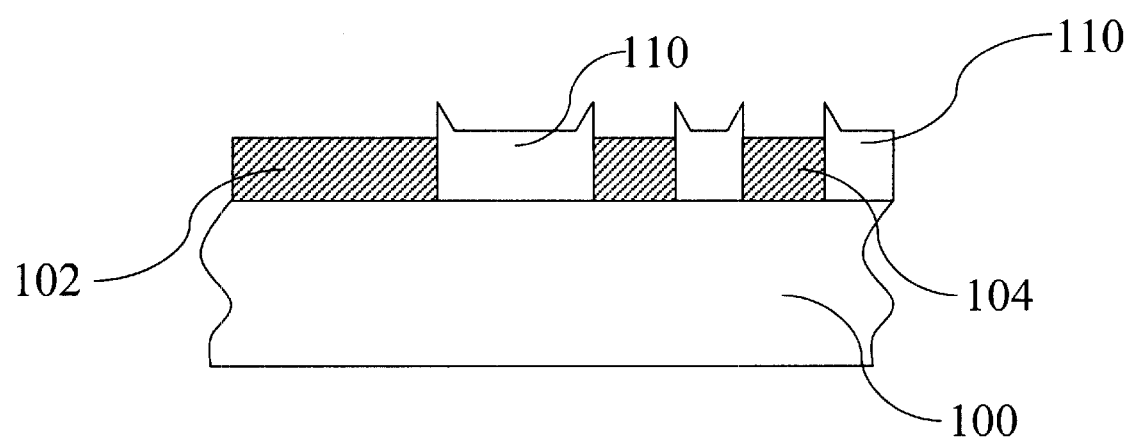

Finally, as shown in FIG. 1G, the silicon nitride of peripheral circuit 106, the first silicon nitride layer 108, the second silicon nitride layer 112, and the excess oxide layer 110 on the first silicon nitride layer 108 (as shown in FIG. 1F) are simultaneously stripped by wet etching using hot phosphoric acid. The etch rate is about 60 angstroms per minute.

Thereby, a planarization method capable of assuring the requirement of high planarity of memory unit of a flash memory without using the prior art CMP technique can be obtained. Also, the process is relatively simplified. Moreover, because the oxide layer 110 formed by the HDPCVD technique has better uniformity of thickness than that formed by the conventional CMP technique, both the function of memory unit of the flash memory and the tolerance of subsequent processes can be effectively enhanced. Additionally, in the steps shown in FIGS. 1D to 1E, the object of removing the oxide layer 110 on the silicon nitride of peripheral circuit and the second silicon nitride layer 112 on the oxide layer is to prevent from damaging the silicon dioxide between polysilicons during the etching process due to difference of thickness. Furthermore, as shown in FIG. 1G, the manufacturing method of the present invention will result in angular structures of silicon dioxide of larger thickness at both sides of polysilicon. The angular structures can increase the contact area of the polysilicon floating gate 104 with the insulating dielectric layer, generally being an oxide-nitride-oxide (ONO) film, thereon and the control gate so as to increase capacitance and quantity of charges and to help electric conduction, hence effectively enhancing the function of memory unit of the flash memory.

To sum up, the present invention discloses a planarization method of memory unit of a flash memory, whereby the requirement of high planarity of memory unit of a flash memory can be assured, the process flow can be simplified, the tolerance of the etching mask can be increased, and the function of memory unit can be effectively enhanced.

Although the present invention has been described with reference to the preferred embodiments thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

I claim:

1. A planarization method of memory unit of a flash memory, comprising the steps of:

forming a polysilicon layer having a memory unit pattern and a silicon nitride layer on a semiconductor substrate, said patterned polysilicon being separately used as a polysilicon of peripheral circuit and polysilicon floating gates;

depositing an oxide layer over said semiconductor substrate;

removing part of said oxide layer to separate oxide layer on and beside said silicon nitride and to still remain excess of said oxide layer;

depositing a second silicon nitride layer on said semiconductor substrate to cover said etched oxide layer and said exposed silicon nitride;

removing said oxide layer and said second silicon nitride on said polysilicon of peripheral circuit;

removing said remained oxide layer on said silicon nitride on said polysilicon of peripheral circuit by sideward etching; and simultaneously removing said silicon nitride layer, said remained oxide layer, and said second silicon nitride layer.

2. The planarization method as claimed in claim 1, wherein said polysilicon layer is formed by the low pressure chemical vapor deposition technique.

3. The planarization method as claimed in claim 1, wherein said silicon nitride layer is formed by the low pressure chemical vapor deposition or the plasma enhanced chemical vapor deposition technique.

4. The planarization method as claimed in claim 1, wherein said oxide layer is a silicon dioxide layer formed by the high density plasma chemical vapor deposition technique.

5. The planarization method as claimed in claim 1, wherein part of said oxide layer is removed by wet etching.

6. The planarization method as claimed in claim 1, wherein said oxide layer and said second silicon nitride on said polysilicon of peripheral circuit are removed by etching.

7. The planarization method as claimed in claim 1, wherein said polysilicon layer used as a memory unit is protected by photoresist when said oxide layer and said second silicon nitride on said polysilicon of peripheral circuit are removed.

8. The planarization method as claimed in claim 1, wherein the sideward etching of said remained oxide layer is performed using wet etching.

9. The planarization method as claimed in claim 8, wherein said wet etching is accomplished using hydrofluoric acid or buffered oxide etch.

10. The planarization method as claimed in claim 1, wherein said second silicon nitride layer is formed by the low pressure chemical vapor deposition or the plasmas enhanced chemical vapor deposition technique.

11. The planarization method as claimed in claim 1, wherein said silicon nitride layer, said remained oxide layer, and said second silicon nitride are simultaneously removed by wet etching with hot phosphoric acid.

* * * * *